United States Patent

[11] 3,588,347

[72] Inventors Liber J. Montone;
Donald C. Walls, Reading, Pa.
[21] Appl. No. 806,919
[22] Filed Mar. 13, 1969
[45] Patented June 28, 1971
[73] Assignee Western Electric Company, Incorporated
New York, N.Y.

[54] METHOD AND APPARATUS FOR ALIGNING A MASK AND A SUBSTRATE USING INFRARED RADIATION

12 Claims, 6 Drawing Figs.

[52] U.S. Cl. .......... 178/6.8, 29/579, 250/83.3HP, 356/51
[51] Int. Cl. .......... H04n 7/18
[50] Field of Search .......... 250/83.31 (R); 178/61 (ND), 6 (IR), 6.8; 29/578, 579, 574; 250/83.3(IR); 356/51

[56] References Cited

UNITED STATES PATENTS

| | | | |
|---|---|---|---|
| 3,313,013 | 4/1967 | Last | 29/578 |
| 3,395,287 | 7/1968 | Rajac | 29/574X |
| 3,465,150 | 9/1969 | Hugle | 250/83.3I(R) |

OTHER REFERENCES

IBM Technical Disclosure Vol. 9, No. 10, March 1967 pp 1385— 1386

IBM Technical Disclosure Vol. 11, No. 3. Aug. 1968 p. 302 (Copies of both in 29—578)

*Primary Examiner*—Robert L. Richardson
*Assistant Examiner*—Richard K. Eckert, Jr.
*Attorneys*—H. J. Winegar, R. P. Miller and S. Gundersen ABSTRACT: Mask areas are aligned on an untreated surface of a semiconductive wafer with elements formed on the opposite side of the wafer by impinging infrared radiation onto both the top and bottom surfaces of the superimposed mask and wafer and viewing the superimposed reflected images and shadow images of the elements and mask areas on a television screen. Infrared radiation passing through the bottom surfaces project shadow images of the elements and the mask areas on the television screen. Infrared radiation impinged from below penetrates the wafer to isolate the element areas on the screen and visible light impinged from above isolates the mask areas and together the isolated areas emphasize the lines of demarcation between the shadows of the mask areas and the element areas to produce clearly distinguishable light images and permit shifting and alignment of the mask areas within the element areas.

INVENTORS
L. J. MONTONE
D. C. WALLS
By D. W. Marks
ATTORNEY

METHOD AND APPARATUS FOR ALIGNING A MASK AND A SUBSTRATE USING INFRARED RADIATION

BACKGROUND OF THE INVENTION

1. Field of the Invention

The invention is directed to a system for precisely aligning opaque areas on a photographic mask placed adjacent to one surface of a semiconductive wafer with processed areas on the opposite side of the wafer. In the production of semiconductive components, such as diodes, it is often necessary to perform a sequence of photoresist and etching operations on both sides of a semiconductive wafer. It is absolutely essential that the discrete areas making up a pattern of processed areas on one side of a wafer are in alignment with the corresponding processed areas on the opposite side of the wafer. The precise alignment is necessary because the wafer will eventually be broken apart into thousands of discrete semiconductive elements (e.g., diodes) and each element must have aligned, processed areas on opposite sides in order to function properly.

A semiconductive wafer is normally processed by performing a number of manufacturing operations to one side of the wafer until its surface is substantially completed. The first face of the wafer may have, for example, a relatively large gold-plated area located in the exact center of each of the discrete semiconductive elements. When the first face is completed, the opposite face of the wafer is then processed by coating the surface with a photoresist material; placing a photographic mask adjacent to that surface; aligning opaque areas on the mask with the corresponding gold-plated areas on the previously processed, opposite side of the wafer; and exposing the photoresist material to ultraviolet light through the mask. The problem arises in attempting to center the respective corresponding areas on the wafer and the mask to achieve alignment.

2. Description of the Prior Art

Some methods of achieving centering and front-to-back mask alignment have involved complicated optical microscope or television camera assemblies to view both sides of the wafer simultaneously. These techniques, however, have required very precise calibration and extremely stable environments in order to function properly. Another method of achieving front-to-back mask alignment has been to pass infrared light through both the silicon wafer and the superimposed mask and view the superimposed shadows of the wafer areas and the mask areas on a television monitor. The difficulty with the previous infrared-television monitoring systems is that the respective shadow areas on the wafer and mask surfaces are indistinguishable from one another on the television screen and it is impossible to center a smaller area within a larger area.

SUMMARY OF THE INVENTION

In one embodiment of the invention, an optical display is generated of composite shadows cast by indicia carried, respectively, on a superimposed photographic mask and a semiconductive wafer. The shadows of each separate indicia are highlighted by irradiating the superimposed surfaces of the mask and wafer to permit the indicia to be aligned and centered one within the other.

BRIEF DESCRIPTION OF THE DRAWING

The nature of the present invention and its various advantages will appear more fully by referring to the following detailed description in conjunction with the appended drawing, in which.

DETAILED DESCRIPTION

Figure 1:
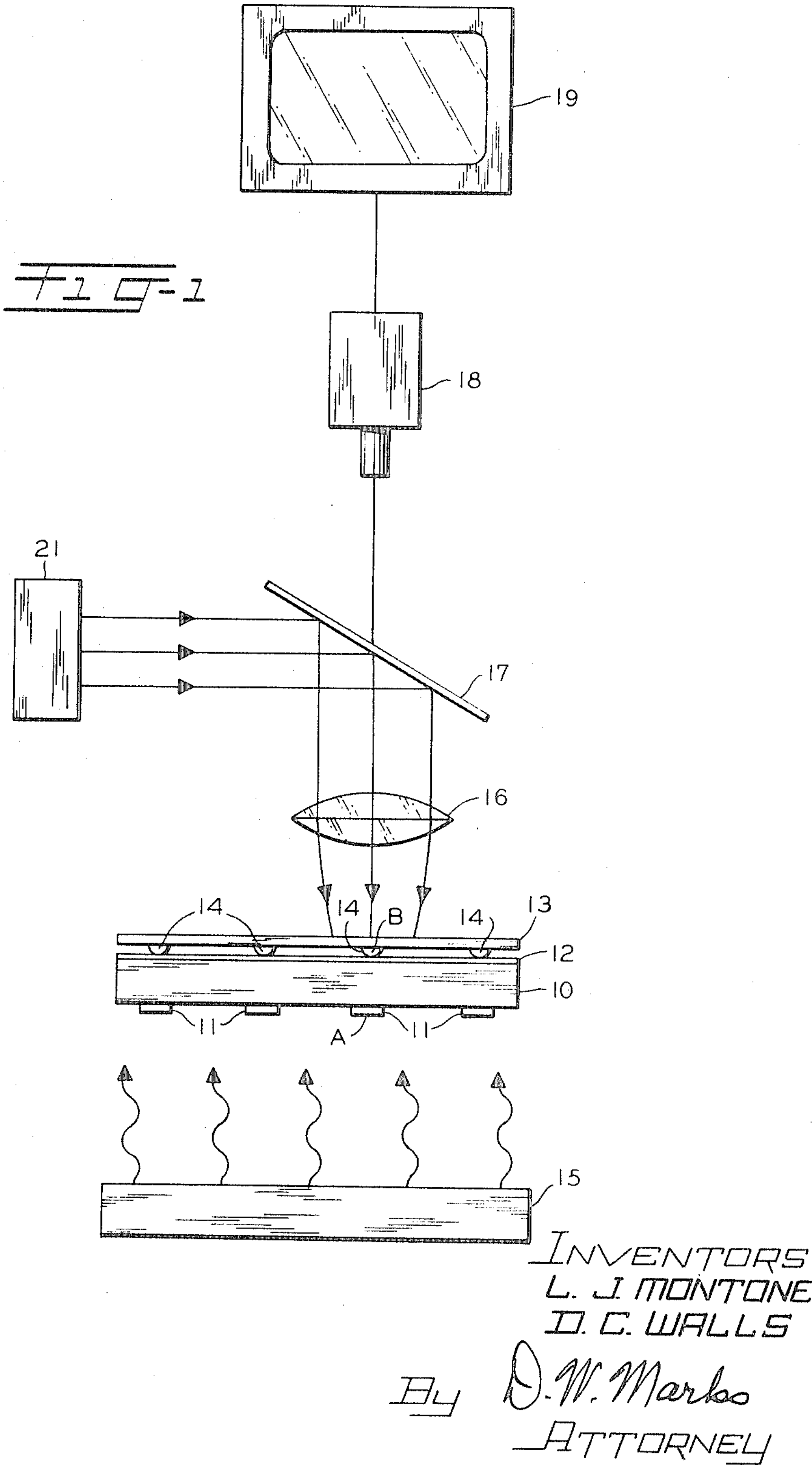
FIG. 1 is a schematic drawing of a back-to-front alignment system constructed in accordance with the invention.
Figure 2:
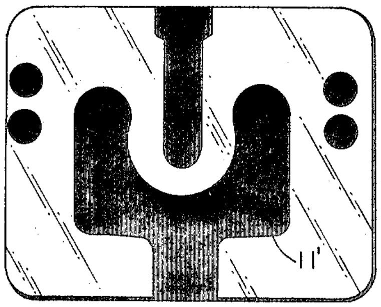
FIG. 2 is a view of the television monitor screen of the system shown in FIG. 1 in which the screen displays an image of an illustrative opaque area on the semiconductive wafer.

Referring to FIG. 1, a silicon wafer 10 having a plurality of discrete processed areas 11–11 on one face thereof is coated on its opposite, unprocessed face with a layer of photoresist material 12 which is sensitive only to ultraviolet light. The processed areas 11–11 may include relatively large gold-plated portions positioned individually on the surface of discrete semiconductive elements. The areas 11–11 may, illustratively, be shaped in the configuration shown in FIG. 2.

Figure 3:
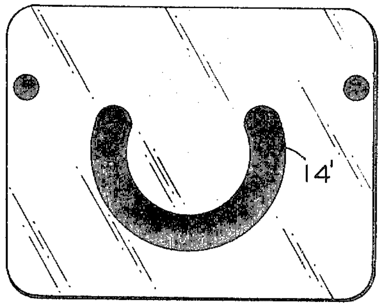
FIG. 3 is a view of the television monitor screen of the system shown in FIG. 1 in which the screen displays an image of an illustrative opaque area on the photographic mask.

Referring again to FIG. 1, the photoresist material 12 is to be exposed to ultraviolet light through a photographic mask 13 which includes a transparent glass sheet having a plurality of opaque areas 14–14 coated thereon to form a pattern. The opaque areas 14–14 may, typically, be formed of a layer of chromium metal deposited on the glass and may assume, illustratively, the configuration shown in FIG. 3. It is to be noted that the relative sizes of the elements shown in FIG. 1 (e.g., the wafer 10 and the processed areas 11–11) are not to scale and are distorted for illustrative purposes. In actuality, there may be thousands of processed areas on a single wafer. Again referring to FIG. 1, each of the opaque areas 14–14 on the mask 13, positioned on one side of the wafer 10, must be aligned with and centered upon the gold-plated areas 11–11 on the opposite side of the wafer 10 before the photoresist material 12 is exposed to ultraviolet light through the mask surface 13.

In order to align the mask and wafer surface areas, a first source of infrared radiation 15 is positioned beneath the superimposed semiconductive wafer 10 and mask 13 so that the radiation is directed to pass through both the wafer and mask. The wavelength of the infrared radiation from the source 15 is preferably in the range of 2.1 microns in order to be capable of being transmitted through either a germanium or a silicon wafer, which becomes transparent at approximately 1.6 and 1.1 microns, respectively. The layer of photoresist material 12 between the wafer 10 and the mask 13 is sensitive only to ultraviolet light and is transparent to and therefore unaffected by the infrared radiation impinged upon it by the source 15.

An objective lens 16 is mounted above the superimposed wafer 10 and mask 13 in alignment with selected ones of the opaque areas 11–11 on the wafer 10 and the opaque areas 14–14 on the mask 13 which are to be examined for alignment. A half-silvered mirror 17 is mounted above the surface of the superimposed wafer and mask and positioned between the objective lens 16 and a television camera 18. The camera 18 is equipped with a vidicon tube which is sensitive both to visible radiation and to radiation in the infrared region. Two commercially available vidicon tubes which have been found satisfactory for this purpose are the RCA Infrared Vidicon No. C 74125 and the type N156Infrared Vidicon manufactured by California Eastern Laboratories, Inc., 1540 Gilbreth Road, Burlingame, California. The objective lens 16 provides a certain measure of magnification of the images of the opaque areas 11–11 and 14–14; however, the television camera circuitry and a television monitor 19, to which the camera 18 is connected, provides a magnification of approximately 1,000 times to ensure a clear and accurate view of the areas.

Figure 4:
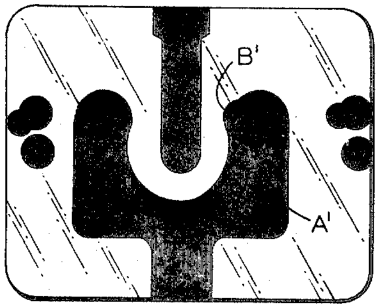
FIG. 4 is a view of the television monitor screen of the system shown in FIG. 1 in which the screen displays a superimposed image of both the opaque area shown in FIG. 2 and the opaque area shown in FIG. 3 with the superimposed mask and wafer areas illuminated only by a lower infrared radiation source.

As the infrared radiation from the source 15 passes through the semiconductive wafer 10 and the photographic mask 13, shadows of the corresponding respective wafer and mask opaque areas 11–11 and 14–14 are cast upon the vidicon tube of the television camera 18 to be viewed upon the screen of the monitor 19. For example, if the television camera 18 is positioned to view the particular wafer and mask areas denominated A and B, respectively, an image on the television monitor 19 appears as shown in FIG. 4. It is to be noted that the superimposed shadows of the two different areas A' and B' appear as one composite shadow and are indistinguishable from one another. Because of this indistinguishability of the two opaque areas, it is impossible for an operator to move the mask 13 so as to center the area B within the area A as is required before the photoresist material is exposed to ultraviolet light. This characteristic has been one of the major disadvantages of prior art alignment systems.

In the alignment system of the present invention shown in FIG. 1, an additional light source 21 is provided to direct radiation onto the surface of the half-silvered mirror 17 so as to impinge that radiation onto the upper surface of the superimposed mask 13 and wafer 10. Although a purely infrared light source will function properly, the radiation from the source 21 is preferably a mixture of both infrared and visible radiation and may, illustratively, be in range of a deep red light having a wavelength from 0.66 to 0.7 microns.

Figure 5:
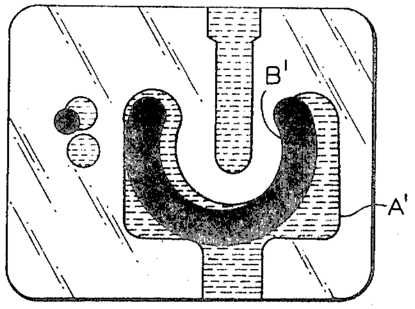
FIG. 5 is a view of the television monitor screen of the system shown in FIG. 1 in which the screen displays an image of the superimposed areas shown in FIGS. 2 and 3 with the superimposed mask and wafer areas illuminated both from below and from above by infrared radiation sources in accordance with the invention.

A somewhat simplified explanation of how the present alignment system is believed to operate is as follows. As infrared radiation from the first source 15 penetrates the lower surfaces of the wafer 10 and the mask 13, the mixed infrared and visible light from the second source 21 impinges down upon the upper surfaces of the mask 13 and wafer 10. The visible component of the mixed radiation penetrates the transparent mask 13 and part of it is partially reflected from the upper surface of the semiconductive wafer 10, while the rest of the visible radiation is partially reflected from the upper surface of the opaque area B on the mask 13. These reflections serve to highlight the opaque area B and produce a more distinctive image B' upon the screen of the monitor 19, as shown in FIG. 5. The infrared component of the mixed radiation from the second source 21 passes through the transparent mask 13 and part of it is reflected from the upper surface of the opaque area B on the mask. The remainder of the infrared radiation penetrates into the body of the semiconductive wafer 10 and a part of that remainder passes all the way through the wafer and out the lower surface. The other part of the infrared radiation entering the body of the semiconductive wafer 10 is partially reflected from the upper surface of the opaque area A on the wafer. The reflected radiation passes back up through the semiconductive wafer, is sensed by the camera 18 and serves to highlight the opaque area A and produce a more distinctive image A' upon the screen of the monitor 19, as shown in FIG. 5.

The superimposed images of the two areas A and B, as viewed by the camera 18, appear as A' and B' on the monitor 19 as shown in FIG. 5. The images of the opaque areas on the mask and wafer may be clearly distinguished from one another and the mask 13 may be moved by an operator to center area B within the periphery of area A. Once the mask 13 is aligned upon the surface of the wafer 10, the photoresist layer 12 is exposed to ultraviolet radiation (from a source not shown) through the mask 13.

Figure 6:
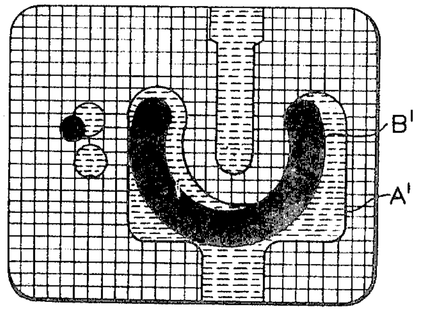
FIG. 6 displays the same image shown in FIG. 5 with a superimposed, calibrated grid structure to enable an operator to determine the precise degree of misalignment between the mask and the wafer areas.

As shown in FIG. 6, the distinguishable composite images of the mask and the wafer areas may also be provided with a superimposed, calibrated grid so that any discontinuities or misalignments may be gaged by the operator to be within or without the required tolerance before the photoresist is exposed.

An alternate embodiment of the invention is found in employing only the upper radiation source 21 of FIG. 1 to illuminate the superimposed mask 13 and wafer 10. Although the distinct images resulting from reflected radiation from the upper source 21 alone are not clearly as bright, clear and precise as with the addition of the lower radiation source 15, the separate images are nevertheless distinguishable on the screen of the monitor 19.

It is to be noted that embodiments of this invention may be constructed using a microscope and infrared image converter tube rather than a television camera and monitor.

We claim:

1. A front-to-back mask alignment system comprising:

a semiconductive wafer having opaque, processed areas on a first surface thereof;

a photographic mask having opaque areas thereon superimposed upon the second surface of said wafer;

a television camera optically aligned with a selected set of opaque areas on said superimposed mask and wafer;

a monitor connected to said television camera for visually displaying the image viewed by said camera; and means for directing a mixture of infrared and visible radiation onto the surfaces of said superimposed mask and wafer from the same side as said television camera to highlight the surfaces of said set of opaque areas and display distinguishable images on the monitor of the respective areas on said mask and said wafer to permit alignment and centering of one area within the other.

2. An alignment system as set forth in claim 1 also including:

means for directing infrared radiation upon the superimposed mask and wafer from the opposite side as said television camera to cast a composite shadow image of the superimposed opaque areas on the mask and wafer upon said camera and aid the radiation from the same side as the camera in generating distinctive images of the mask and wafer opaque areas on the screen of the monitor.

3. An alignment system as set forth in claim 1 wherein the surface of said mask is nearer said television camera than the surface of said wafer.

4. A front-to-back mask alignment system comprising:

a semiconductive wafer having opaque, processed areas on a first surface thereof;

a photographic mask having opaque areas thereon superimposed upon the second surface of said wafer;

a television camera optically aligned with a selected set of opaque areas on said superimposed mask and wafer;

a monitor connected to said television camera for visually displaying the image viewed by said camera;

means for directing infrared radiation onto the surfaces of said superimposed mask and wafer from the opposite side from said television camera to cast shadows of the selected set of opaque areas onto said television camera and display a composite shadow of said areas on said monitor; and means for directing infrared radiation onto the surfaces of said superimposed mask and wafer from the same side as said television camera to highlight the surfaces of said set of opaque areas and display distinguishable images on the monitor of the respective areas on said mask and said wafer to permit alignment and centering of one area within the other.

5. An alignment system as set forth in claim 4 also including:

means for directing visible radiation upon the superimposed mask and wafer from the same side as said television camera to aid the infrared radiation in highlighting the respective mask and wafer opaque areas.

6. An alignment system as set forth in claim 4 wherein the surface of said mask is nearer said television camera than the surface of said wafer.

7. A front-to-back alignment system for aligning opaque processed areas on a first surface of a semiconductive wafer with opaque areas on a photographic mask superimposed upon the second surface of said wafer of the type wherein a television camera is optically aligned with a selected set of opaque areas on said superimposed mask and wafer, a television monitor is connected to said camera to visually display an image viewed by said camera, and infrared radiation is directed onto said superimposed mask and wafer from the opposite side from said camera to cast shadows of said selected set of opaque areas onto said television camera and display a composite shadow of said areas on said monitor, the improvement comprising:

means for directing a mixture of visible and infrared radiation onto said superimposed mask and wafer from the same side as said camera to highlight the surfaces of the set of opaque areas and display distinguishable images on the monitor of the respective areas on said mask and said wafer to permit alignment and centering of one area within the other.

8. A method of visually displaying the registration of a pattern on a first medium with a pattern on a second medium, the steps comprising:

mounting the first medium in a superimposed relationship above the second medium;

generating an optical display of composite shadows cast by the patterns on said first and second mediums; and irradiating the surfaces of said first and second mediums with a mixture of infrared and visible radiation to highlight the separate components of said composite shadows and make the shadow of the pattern on the first medium distinguishable from the shadow of the pattern on the second medium.

9. A method of visually displaying superimposed, distinguishable composite images of patterns disposed on respective surfaces of a first and second medium, comprising:

mounting the first medium so that a surface of the first medium is in superimposed relationship with a surface of the second medium;

generating an optical display of composite shadows cast by the patterns on said superimposed first and second mediums; and irradiating the surfaces of said superimposed first and second mediums simultaneously in opposite directions with infrared radiation to highlight the separate components of said composite shadows and make the shadow of the pattern on the first medium distinguishable from the shadow of the pattern on the second medium.

10. A method as set forth in claim 9 wherein said irradiating step in one direction includes impinging a mixture of visible and infrared radiation onto the surfaces of the first and second mediums.

11. A method of aligning and centering an opaque, processed area on a first surface of a semiconductive wafer with an opaque area on a photographic mask, the steps comprising:

mounting the mask in a superimposed relationship over a second opposite surface of the wafer;

displaying an image of the opaque area on the mask in superimposed relationship to an image of the opaque area on the wafer; and irradiating the surface of the mask with a mixture of infrared and visible radiation in a direction to pass said radiation from said mask through said wafer to highlight the surfaces of the superimposed opaque areas and display distinguishable images of the respective areas on said mask and said wafer to permit aligning and centering of one area within the other.

12. The method as set forth in claim 11 wherein said irradiating step includes simultaneously irradiating said first surface of the wafer with a second source of infrared radiation in a direction to pass said radiation from the wafer through the superimposed mask.